(12) United States Patent
Shim (10) Patent No.: US 8,451,680 B2
(45) Date of Patent: May 28, 2013

(54) METHOD OF DRIVING A SEMICONDUCTOR MEMORY DEVICE WITH A SENSE AMPLIFIER CONTROLLER FOR MAINTAINING THE CONNECTION OF A PREVIOUSLY SELECTED MEMORY CELL ARRAY

(75) Inventor: Young-Bo Shim, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 42 days.

(21) Appl. No.: 13/166,476

(22) Filed: Jun. 22, 2011

(65) Prior Publication Data

US 2011/0249523 A1   Oct. 13, 2011

Related U.S. Application Data

(62) Division of application No. 11/987,827, filed on Dec. 5, 2007, now Pat. No. 7,995,421.

(30) Foreign Application Priority Data

Feb. 23, 2007   (KR) .............................. 2007-0018307

(51) Int. Cl.
*G11C 8/12* (2006.01)

(52) U.S. Cl.
USPC ................. 365/230.06; 365/230.03; 365/196; 365/195; 365/190; 365/203; 365/227

(58) Field of Classification Search
USPC ............... 365/230.03, 230.06, 196, 195, 191, 365/190, 205, 208, 207, 203, 227, 226
See application file for complete search history.

(56) References Cited

U.S. PATENT DOCUMENTS

| | | | | |
|---|---|---|---|---|
| 5,768,201 | A * | 6/1998 | Oh ................................ | 365/205 |
| 6,219,279 | B1 * | 4/2001 | Manolescu et al. ...... | 365/185.18 |
| 6,650,147 | B2 * | 11/2003 | Conte et al. ...................... | 327/51 |
| 6,744,685 | B2 * | 6/2004 | Mizugaki ...................... | 365/222 |
| 7,002,862 | B2 * | 2/2006 | Kang ............................ | 365/205 |
| 7,301,844 | B2 * | 11/2007 | Dono et al. ................... | 365/222 |

* cited by examiner

*Primary Examiner* — Andrew Q Tran
(74) *Attorney, Agent, or Firm* — IP & T Group LLP (57) ABSTRACT

A semiconductor memory device includes a bit line sense amplifier block array, upper and lower memory cell arrays and a sense amplifier controller. The bit line sense amplifier block array senses and amplifies data of a memory cell array. The upper and the lower memory cell arrays are respectively connected to upper and lower sides of the bit line sense amplifier block array and store the data in the memory cell array. The sense amplifier controller selectively connects one of the upper and lower memory cell arrays to the bit line sense amplifier block array in response to an active command, and releases the connection when a corresponding one of the upper and lower memory cell arrays are not selected but overdriven.

2 Claims, 5 Drawing Sheets

METHOD OF DRIVING A SEMICONDUCTOR MEMORY DEVICE WITH A SENSE AMPLIFIER CONTROLLER FOR MAINTAINING THE CONNECTION OF A PREVIOUSLY SELECTED MEMORY CELL ARRAY

CROSS-REFERENCE TO RELATED APPLICATION

This application is a division of U.S. patent application Ser. No. 11/987,827 filed on Dec. 5, 2007 now U.S. Pat. No. 7,995,421, which claims priority to Korean patent application number 10-2007-0018307, filed on Feb. 23, 2007. The disclosure of each of the foregoing applications is incorporated herein by reference in its entirety.

BACKGROUND

The present subject matter relates to semiconductor design technologies; and, more particularly, to a semiconductor memory device having a bit line sense amplifier with small power consumption.

Figure 1:
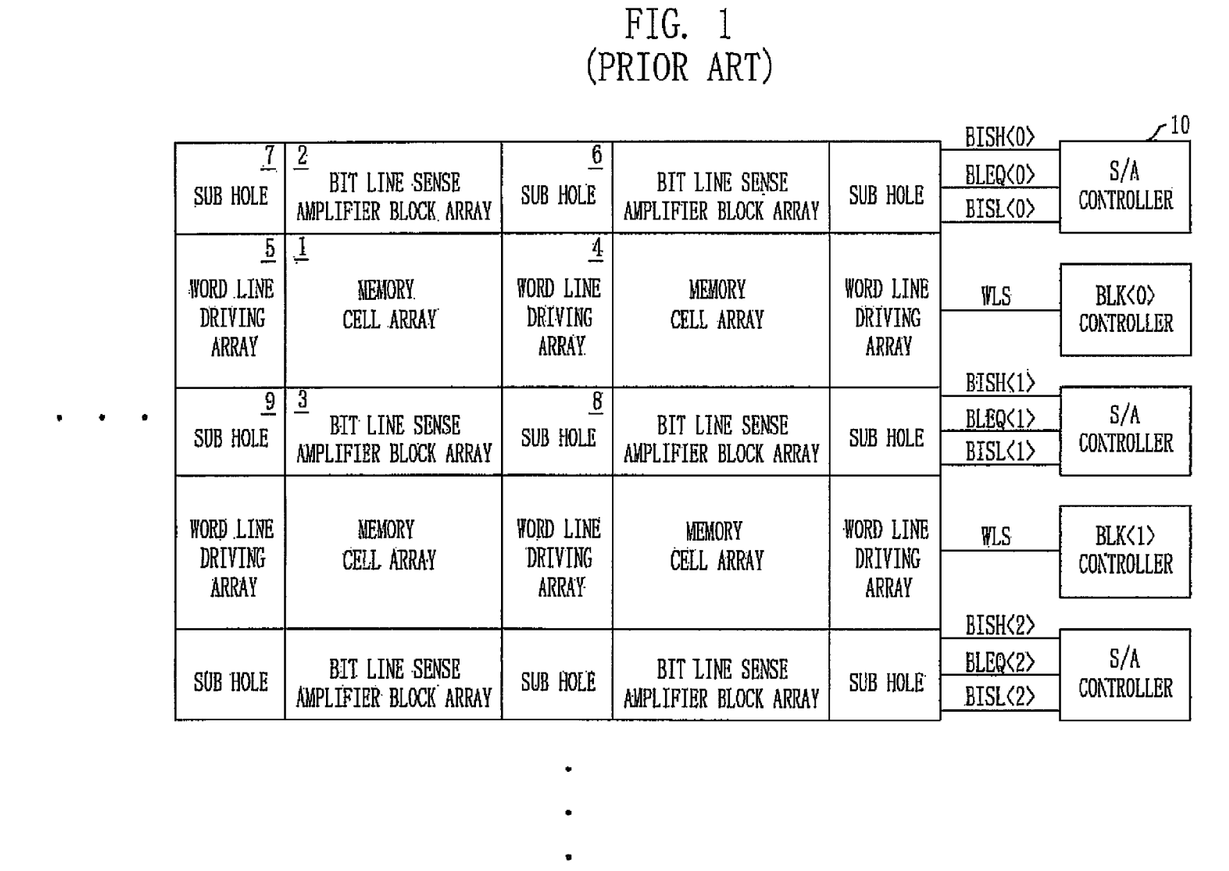
FIG. 1 illustrates an arrangement view of blocks within a conventional semiconductor memory device.

FIG. 1 illustrates an arrangement view of blocks within a conventional semiconductor memory device, which include memory cell arrays, sub holes, bit line sense amplifier block arrays, and word line driving arrays.

As shown in FIG. 1, the conventional semiconductor memory device includes a memory cell array 1 having a plurality of memory cells, bit line sense amplifier block arrays 2 and 3 located at upper and lower sides of the memory cell array 1 for sensing and amplifying data, word line driving arrays 4 and 5 arranged at left and right sides of the memory cell array 1 for selecting the cell memory array, a plurality of S/A controllers 10 for applying an equalization signal BLEQ<0:2>, and a bit line separation signal BISH<0:2> and BISL<0:2> to corresponding sub holes in response to a corresponding cell array selection signal BS<0>, sub holes 6, 7, 8, and 9 for amplifying signals applied from the S/A controllers 10 and applying them to the corresponding bit line sense amplifier block arrays 2 and 3, and a plurality of BLK<0:1> controllers for controlling the driving of the corresponding word line driving arrays 4 and 5 in response to the cell array selection signal BS<0>.

Here, adjacent memory cell arrays share the word line driving arrays and the bit line sense amplifier block arrays with each other. Therefore, it is required to control the operation so that only a selected memory cell array is connected to the bit line sense amplifier block array at the time of data amplification. In this regard, one memory cell and one bit line sense amplifier block will be shown and described in detail.

Figure 2:
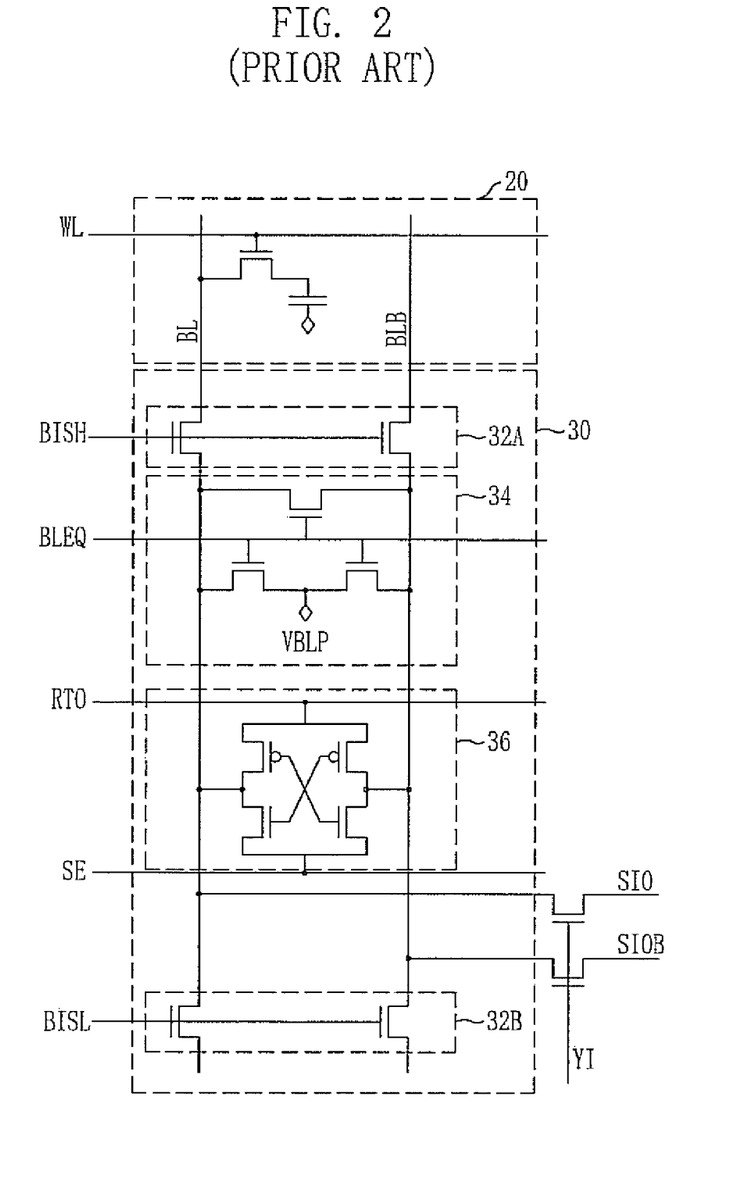
FIG. 2 is a diagram showing a circuit of a memory cell and a bit line sense amplifier block the conventional semiconductor memory device.

FIG. 2 is a diagram showing a circuit of a memory cell and a bit line sense amplifier block within a conventional semiconductor memory device.

The circuit shown in FIG. 2 is divided into a memory cell 20 for storing data and a bit line sense amplifier block 30 for sensing and amplifying a voltage level difference of a pair of bit lines to which the data of the memory cell 20 is applied.

More specifically, the bit line sense amplifier block 30 is provided with separation portions 32A and 32B for releasing the connection of the memory cell 20 and a bit line sense amplifier 36 in response to separation signals BISH and BISL, an equalizing portion 34 for precharging and equalizing levels of the pair of bit lines BL and BLB in response to an equalization signal BLEQ, and the bit line sense amplifier 36 which is active by applying voltages to drive power lines RTO and SE, and senses and amplifies a voltage level difference of the pair of bit lines BL and BLB.

For reference, the memory cell 20 is arranged in the memory cell array 1 shown in FIG. 1, and the bit line sense amplifier 36, the equalizer 34 and the separation portions 32A and 32B are arranged in each of the bit line sense amplifier block arrays 2 and 3 shown in FIG. 1.

Meanwhile, as shown in FIG. 2, one memory cell 20 is connected at an upper side of one bit line sense amplifier 36 and another memory cell (not shown) is connected at a lower side thereof. Thus, during a normal operation of amplifying data, the upper and lower separation portions 32A and 32B are provided in order to control the connection of only one of the upper memory cell 20 and the lower memory cell to the bit line sense amplifier 36 according to a selection.

The following is a brief description for driving of the separation portions 32A and 32B. During a precharge interval, since the upper and lower separation signals BISH and BISL all have a logic high level, it can be seen that the separation portions 32A and 32B become active and thus, the upper memory cell 20 and the lower memory cell are all connected to the bit line sense amplifier 36 through the pair of bit lines BL and BLB. If the upper memory cell 20 is selected, the upper separation signal BISH has a logic high level and the lower separation signal BISL has a logic low level. Therefore, it can be seen that the upper memory cell 20 is still connected to the pair of bit lines BL and BLB by the upper separation portion 32A, but the lower memory cell is disconnected from the pair of bit lines BL and BLB by the lower separation portion 32B.

Meanwhile, as mentioned above, the upper and lower separation signals BISH and BISL that control the driving of the separations portions 32A and 32B are supplied from the S/A controller 10. The following is a detailed description of the conventional art that controls the activation of the separation signals BISH and BISL during the driving of the S/A controller 10.

For reference, the upper separation signal BISH is a signal for controlling the connection of the memory cell 20 arranged at the upper side of the bit line sense amplifier block 30, and the lower separation signal BISL is a signal for controlling the connection of the memory cell (not shown) arranged at the lower side of the bit line sense amplifier block 30.

Figure 3:
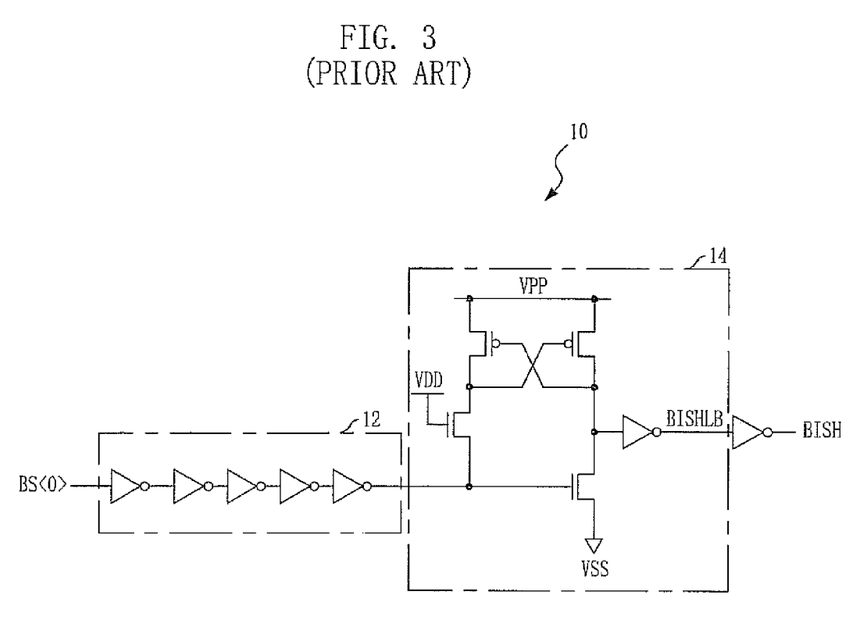
FIG. 3 is an internal circuit diagram of the S/A controller for controlling the switching of a pair of bit lines within the conventional semiconductor memory device.

FIG. 3 is an internal circuit diagram of the S/A controller 10 for controlling the switching of a pair of bit lines BL and BLB within the conventional semiconductor memory device.

Referring to FIG. 3, the conventional semiconductor memory device includes a delay circuit 12 for delaying and inverting a cell array selection signal BS<0>, and a level converter 14 for inverting an output signal of the delay circuit 12 to output an upper pre-separation signal BISHLB of high voltage VPP level.

For reference, an upper separation signal BISH that controls the switching between the bit line sense amplifier and the bit lines has an inverted logic level of the upper pre-separation signal BISHLB.

Hereinafter, the operation of the S/A controller 10 within the semiconductor memory device shown in FIG. 3 will be described.

First, a normal operation when a memory cell array is selected will be discussed. When an active command ACT and a row address are applied from outside, the cell array selection signal BS<0> is activated to a logic high level for rendering the corresponding memory cell array active. Then, the delay circuit 12 inverts the cell array selection signal BS<0> to provide an output signal of logic low level. In succession, the level converter 14 outputs the upper pre-separation signal BISHLB of logic high level in response to the output signal of logic low level from the delay circuit 12.

Thus, the upper memory cell 20 is connected to the bit line sense amplifier block 30 through the pair of bit lines BL and BLB in response to the upper separation signal BISH which is activated to the logic high level.

For reference, the control block for generating the lower separation signal BISL has the same circuit implementation as that of FIG. 3, except that it receives BS<1> as the cell array selection signal. Therefore, a further description thereof will be omitted here for simplicity.

Next, a normal operation when a memory cell array is not selected and a case in which a precharge command is applied will be discussed.

When the memory cell array is not selected, the cell array selection signal BS<0> has a logic low level. Then, the delay circuit 12 outputs the activation sense signal of logic high level in response to the deactivation of the cell array selection signal BS<0>. Subsequently, the level converter 14 outputs the upper pre-separation signal BISHLB of logic low level.

Further, when a precharge command PCG is inputted, the selected cell array selection signal BS<0> is deactivated and thus, the same operation is carried out, as in the case where the memory cell array is not selected.

Therefore, when the upper separation signal BISH is deactivated to a logic low level, the connection between the upper memory cell array 20 and the bit line sense amplifier block 30 is disabled.

Further, the cell array selection signal BS<0> is a signal that is activated to select the corresponding memory cell array in response to the active command ACT and the row address being applied therewith.

As mentioned above, since the conventional semiconductor memory device receives the cell array selection signal BS<0> that is generated by the active command ACT and the row address being applied thereto and deactivated by the precharge command PCG, and generates the upper separation signal BISH, the upper separation signal BISH is toggled whenever the active command ACT and the precharge command PCG are applied. In other words, during the normal operation, the conventional semiconductor memory device repeatedly performs the process in which the memory cell array and the pair of bit lines are connected by the active command ACT and the row address and then the switching is made in response to the precharge command PCG being applied.

In this manner, the separation signal is switched from a logic high level to a logic low level, and vice versa, whenever the active command ACT and the precharge command PCG are applied, so that current consumption occurs by such toggling.

Further, the separation signal has a high voltage level that is created by charge-pumping a core voltage within the device, and thus, current consumption by toggling is very large. Moreover, since the efficiency of high voltage generation is about 25% to about 30%, current consumption caused by such toggling in the entire device may be about three to about four times that of a switching current of the separation signal.

SUMMARY

Embodiments of the present subject matter are directed to provide a semiconductor memory device including a bit line sense amplifier capable of reducing power consumption.

In accordance with an aspect of the present subject matter, there is provided a semiconductor memory device including bit line sense amplifier block array, upper and lower memory cell arrays and a sense amplifier controller. The bit line sense amplifier block array senses and amplifies data of a memory cell array. The upper and the lower memory cell arrays are respectively connected to upper and lower sides of the bit line sense amplifier block array and store the data in the memory cell array. The sense amplifier controller selectively connects one of the upper and lower memory cell arrays to the bit line sense amplifier block array in response to an active command, and releases the connection when a corresponding one of the upper and lower memory cell arrays are not selected but overdriven.

In accordance with another aspect of the present subject matter, there is provided a driving method of a semiconductor memory device in which adjacent upper and lower memory cell arrays share a bit line sense amplifier block array including allowing only the upper memory cell array to occupy the bit line sense amplifier block array in response to an active command and maintaining an occupation of the bit line sense amplifier block array by the upper memory cell array in response to input of a precharge command.

In accordance with a further another aspect of the present subject matter, there is provided a driving method of a semiconductor memory device in which adjacent upper and lower memory cell arrays share a bit line sense amplifier block array including allowing only the upper memory cell array to occupy the bit line sense amplifier block array in response to an active command firstly inputted; maintaining an occupation of the bit line sense amplifier block array by the upper memory cell array in response to input of a precharge command; sensing an active state of the bit line sense amplifier block array caused by an active command secondly inputted; and releasing the occupation of the bit line sense amplifier block array by the upper and the lower memory cell arrays in case that the bit line sense amplifier block array is in the active state.

DETAILED DESCRIPTION

Hereinafter, preferred embodiments of the present subject matter will be described in detail with reference to the accompanying drawings so that the subject matter can be easily carried out by those skilled in the art.

Figure 4:
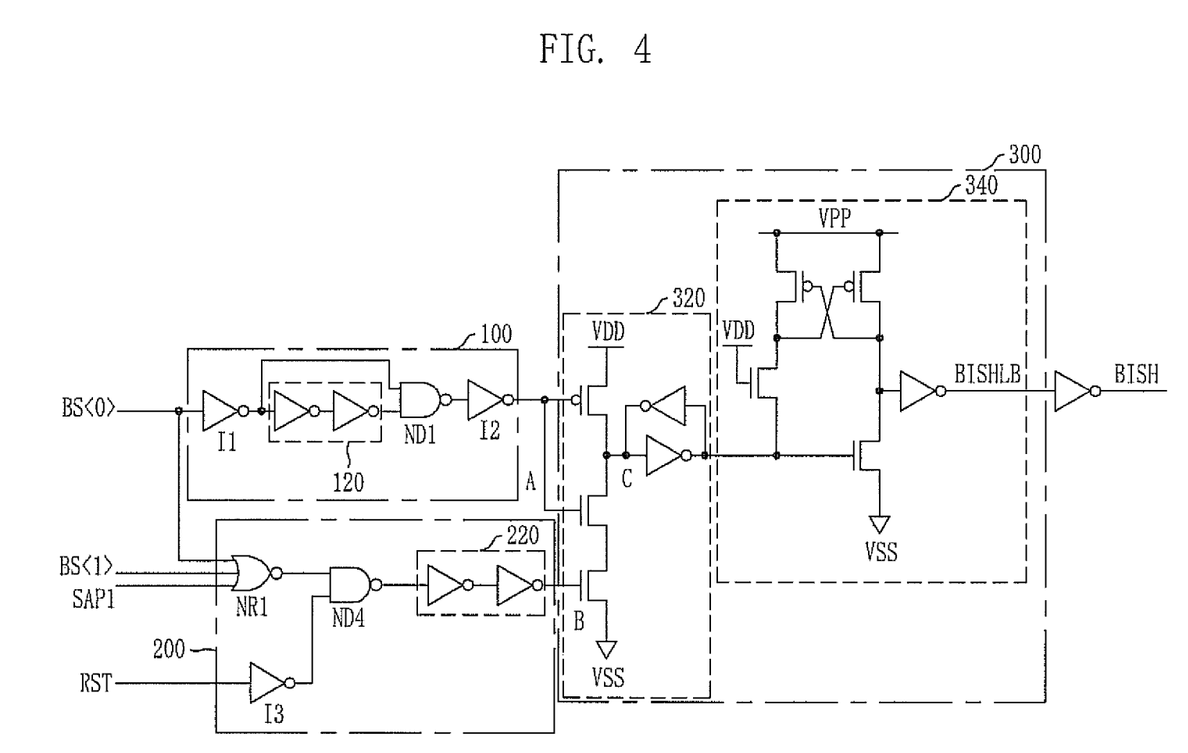
FIG. 4 is an internal circuit diagram of a block for controlling the switching of a pair of bit lines within a semiconductor memory device in accordance with a preferred embodiment of the present subject matter.

FIG. 4 is an internal circuit diagram of a block for controlling the switching of a pair of bit lines within an exemplary semiconductor memory device.

Referring to FIG. 4, the exemplary semiconductor memory device includes a selection sensor 100 for sensing selection of a memory cell array to output a selection sense signal A, a precharge controller 200 for sensing nonselection of the memory cell array to provide a precharge control signal B, and a signal generator 300 for generating an upper pre-separation signal BISHLB in response to the selection sense signal A and the precharge control signal B.

The selection sensor 100 is provided with an inverter I1 for receiving a cell array selection signal BS<0> and outputting an inverted cell array selection signal BS<0>, an inverter chain 120 for delaying and outputting an output signal of the inverter I1, an NAND gate ND1 receiving an output signal of the inverter chain 120 and an output signal of the inverter I1 as its inputs, and an inverter I2 for inverting an output signal of the NAND gate ND1 to output the selection sense signal A.

The precharge controller 200 is provided with a NOR gate NR1 to receive cell array selection signals BS<0> and BS<1> and an over driving control signal SAP1 as its inputs, an inverter I3 for inverting a reset signal RST, an NAND gate ND4 receiving output signals of the inverter I3 and the NOR gate NR1 as its inputs, and an inverter chain 220 for delaying an output signal of the NAND gate ND4 to produce the precharge control signal B.

The signal generator 300 is provided with a signal input portion 320 for activating an output signal in response to the activation of the selection sense signal A and deactivating the output signal in response to the deactivation of the selection sense signal A and the activation of the precharge control signal B, and a level converter 340 for inverting an output signal of the signal input portion 320 to produce the upper pre-separation signal BISHLB of high voltage VPP level.

For reference, the exemplary semiconductor memory device includes a bit line sense amplifier block array for sensing and amplifying data of the memory cell array, and memory cell arrays arranged adjacent to upper and lower sides of the bit line sense amplifier block array for sharing the same and storing data.

The upper separation signal BISH for controlling the switching between the memory cell array and the bit line sense amplifier block array has an inverted logic level of the upper pre-separation signal BISHLB.

Therefore, the semiconductor memory device shown in FIG. 4 controls the connection of the upper memory cell array and the bit line sense amplifier block array by the upper separation signal BISH, and controls the connection of the lower memory cell array and the bit line sense amplifier block array by the lower separation signal BISL. Further, the exemplary semiconductor memory device controls on and off operations depending on whether or not the same memory cell array is selected, unlike the conventional art that repeatedly controls on and off operations whenever the active command ACT and the precharge command PCG are applied. Details thereof will be given below with reference to an operation waveform diagram.

Now, the operation of the present subject matter shown in FIG. 4 will be described in detail with reference to FIG. 5.

Figure 5:
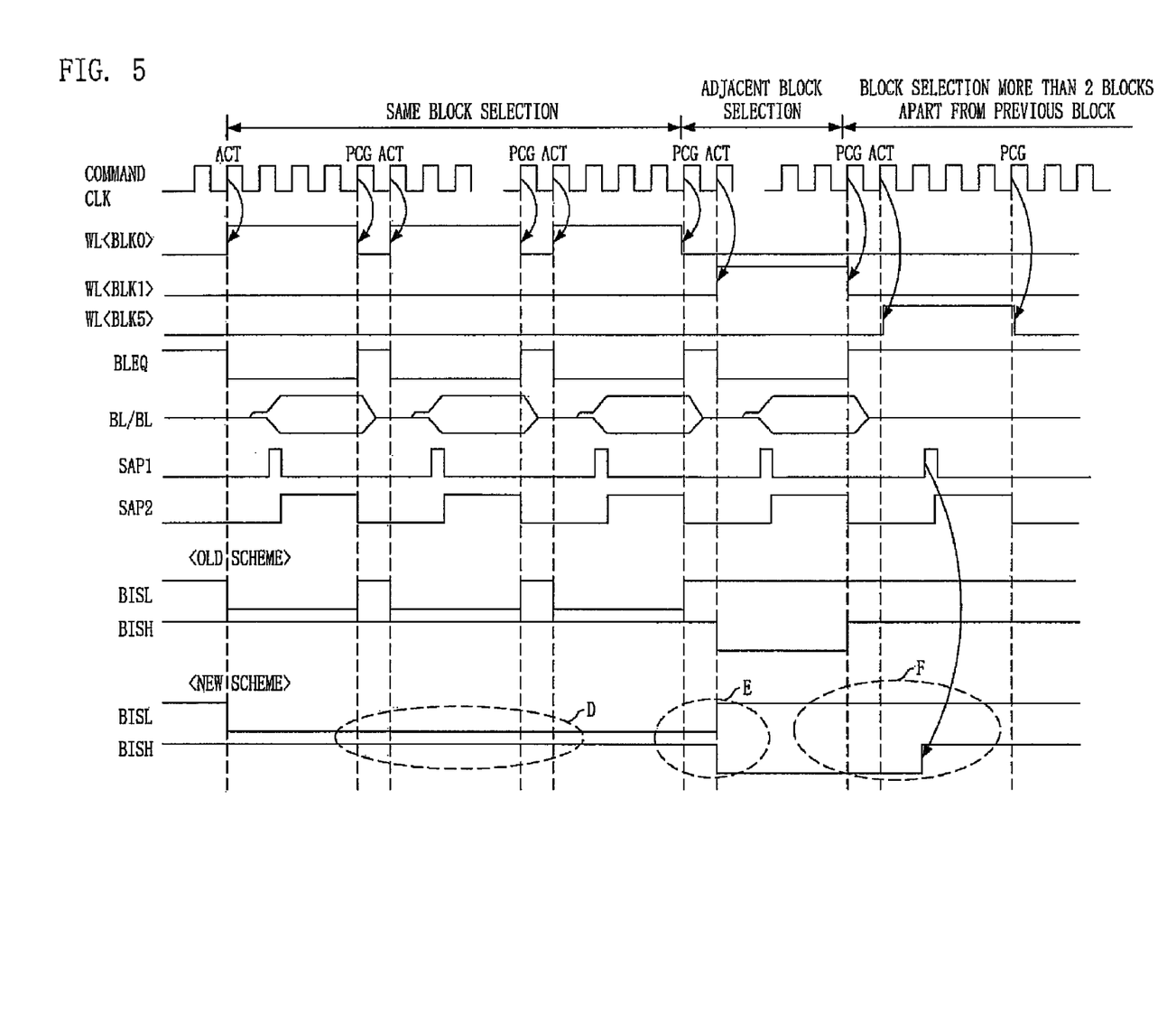
FIG. 5 is an operation waveform diagram of the semiconductor memory device of the present subject matter shown in FIG. 4.

FIG. 5 shows an operation waveform diagram of the present subject matter shown in FIG. 4.

Although not shown in the drawing, first, in case the reset signal RST has a logic high level at an initial operation of the semiconductor memory device, the selection sensor 100 outputs the selection sense signal A of logic high level and the precharge controller 200 produces the precharge control signal B of logic high level in response to the reset signal RST. Then, the signal input portion 320 outputs a logic low level signal to a node C which is subsequently inverted to a logic high level. The level converter 340 converts this logic high level signal and initializes the upper pre-separation signal BISHLB to a logic low level and outputs it. Thus, the upper separation signal BISH and the lower separation signal BISL are initialized to a logic high level.

The following is a description for a case in which after the initial operation, the active command ACT and the row command are applied and the cell array selection signal BS<1> has a logic high level so that a word line WL<BLK0> of the upper memory cell array is selected, and the cell array selection signal BS<0> has a logic low level.

In this case, the selection sensor 100 outputs the selection sense signal A of logic high level in response to the cell array selection signal BS<0>, and the precharge controller 200 outputs the precharge control signal B of logic high level in response to the cell array selection signal BS<1>. Then, the signal input portion 320 outputs a logic high level in response to the logic high levels of the selection sense signal A and the precharge control signal B. Next, the level converter 340 outputs the upper pre-separation signal BISHLB of logic low level. That is, the upper separation signal BISH has a logic high level.

Although not shown in the drawing, the lower memory cell array is selected, and therefore, the lower separation signal BISL has a logic high level. Thus, only the lower memory cell array is connected to the bit line sense amplifier block array.

Thereafter, when the precharge command PCG is applied, the cell array selection signal BS<1> is changed to a logic low level. Then, the selection sensor 100 maintains the selection sense signal A at the logic high level in response to the deactivation of the cell array selection signal BS<0>, and the precharge controller 200 changes the precharge control signal B from a logic high level to a logic low level in response to the cell array selection signal BS<1>. There is no path within the signal input portion 320 formed by the selection sense signal A and the precharge control signal B, thereby maintaining a previous value of the output node. Thus, the level converter 340 provides the upper pre-separation signal BISHLB at a logic low level. The upper separation signal BISH has a logic high level and the lower separation signal BISL has a logic low level.

Hence, the logic levels of the upper and lower separation signals BISH and BISL are maintained, as in the case in which the active command ACT is applied. That is, it can be seen that the exemplary semiconductor memory device can maintain the logic level value by the active command even when the precharge command is applied, unlike the conventional art. In other words, the exemplary semiconductor memory device does not generate the toggling phenomenon of the conventional art, which takes place whenever the precharge command is applied.

In case a newly applied active command ACT and a row address access the same previous memory cell array, the cell array selection signal BS<1> has a logic high level and the cell array selection signal BS<0> has a logic low level so that the word line WL<BLK0> of the same memory cell array is chosen.

The selection sensor 100 outputs the selection sense signal A of logic high level in response to the cell array selection signal BS<0>, and the precharge controller 200 produces the precharge control signal B of logic high level in response to the change of the cell array selection signal BS<1> from a logic low level to a logic high level. Then, the signal input portion 320 outputs a logic high level in response to the logic high levels of the selection sense signal A and the precharge control signal B. Next, the level converter 340 provides the upper pre-separation signal BISHLB of logic low level. That is, the upper separation signal BISH has a logic high level and the lower separation signal BISL has a logic low level.

This means that if the same memory cell array is consecutively selected, the previous levels of the upper separation signal BISH and the lower separation signal BISL are maintained as is. That is, it can be seen that the levels of the upper separation signal BISH and the lower separation signal BISL are not continuously changed by the active command, but particularly the previous levels are maintained if the same block is selected.

After that, when the precharge command PCG is applied, the upper separation signal BISH is maintained in a value set by the active command, i.e., at a logic high level, according to the operation as set forth above. The lower separation signal BISL is maintained at a logic low level.

The following is a description for a case in which a newly applied active command ACT and a row address selects an adjacent memory cell array, not the same memory cell array. Here, the cell array selection signal BS<0> has a logic high level and the cell array selection signal BS<1> has a logic low level so that the word line WL<BLK1> of the lower memory cell array is chosen.

The selection sensor 100 outputs the selection sense signal A of logic low level in response to a logic high level of the cell array selection signal BS<0>, and the precharge controller 200 produces the precharge control signal B of logic high level in response to the logic high level of the cell array selection signal BS<0>. Then, the signal input portion 320 outputs a logic high level in response to the selection sense signal A and a logic low level to its own output node. Next, the level converter 340 inverts an output signal of the signal input portion 320 and outputs the inverted output signal to an inverter that changes the upper pre-separation signal BISHLB from a logic low level to a logic high level.

Thus, the upper separation signal BISH is activated by the change from a logic high level to a logic low level, and the lower separation signal BISL is deactivated by the change from a logic low level to a logic high level. The lower separation signal BISL, it is changed from a logic low level to a logic high level by the deactivation of the cell array selection signal BS<1>.

After that, when the precharge command PCG is applied, the upper separation signal BISH is maintained at a logic low level, and the lower separation signal BISL is maintained at a logic high level, according to the operation as set forth above.

The following is a description for a case in which a newly applied active command ACT and a row address selects a memory cell array more than 2 blocks apart from the previous one. Therefore, if a word line WL<5> is selected, the cell array selection signal BS<0:1> has a logic low level.

Then, the selection sensor 100 outputs the selection sense signal A of logic high level in response to the cell array selection signal BS<0>. And the precharge controller 200 outputs the precharge control signal B of logic high level during the activation of an over driving signal SAP1, and outputs the precharge control signal B of logic low level if it is deactivated. Subsequently, the signal generator 300 changes the upper pre-separation signal BISHLB from a logic high level to a logic low level in response to the logic high levels of the selection sense signal A and the precharge control signal B.

In response to the change of the precharge control signal B from a logic high level to a logic low level, the logic low level of the upper separation signal BISH is maintained. Further, the lower separation signal is also changed from a logic high level to a logic low level in response to the deactivation of the cell array selection signal BS<1>.

Thus, the upper and the lower separation signals BISH and BISL all have a logic high level.

After that, although the precharge command PCG is applied, the upper separation signal BISH is maintained at a logic low level.

A comparison of the conventional art and the exemplary semiconductor memory device is explained as follows.

First, in case of accessing the same memory cell array, it can be seen that the lower separation signal BISL of the conventional art is synchronously toggled with input of the active command ACT and the precharge command PCG. On the other hand, it can be found that the lower separation signal BISL, which is a portion indicated by "D", according to the exemplary semiconductor memory device is maintained as its own value, rather than being synchronously toggled with input of the active command ACT and the precharge command PCG. Namely, it can be recognized that the exemplary semiconductor memory device maintains its value without toggling if the same memory cell arrays is consecutively accessed.

Further, in case of accessing an adjacent memory cell array, it can be seen that the lower separation signal BISL of the conventional art is synchronously precharged with input of the precharge command PCG and the level of the upper separation signal BISH is synchronously changed with input of the active command ACT to select the adjacent memory cell array. On the other hand, it can be found that the levels of the upper and lower separation signals BISH and BISL of the exemplary semiconductor memory device are synchronously changed with input of a new active command ACT, which is a portion indicated by "E", to select the adjacent memory cell array. This means that since the exemplary semiconductor memory device generates a signal upon selection of the memory cell array, its value is adjusted by a new active command.

In addition, in case of selecting a nonadjacent memory cell array, e.g., more than 2 blocks apart from the previous one, it can be seen that the level of the upper separation signal BISH of the conventional art is synchronously changed with the precharge command PCG. On the other hand, it can be recognized that after activation of the active command, the level of the upper separation signal BISH of the exemplary semiconductor memory device is synchronously changed with the over driving signal SAP1. That is, if the memory cell array is not selected, the level transition is made in response to the over driving signal SAP1 being applied after the active command.

As described above, the exemplary semiconductor memory device maintains the operation set by the active command as it is, even when the precharge command PCG is applied, indicating the control operation to switch the connection of the bit line sense amplifier array and the memory cell array, unlike the conventional art. That is, the operation is performed based on the point of time of selection of the memory cell array. Accordingly, in case of consecutively selecting the same memory cell array, since the corresponding separation signal does not need to be switched, current consumption can be reduced as being no toggling.

As a result, the exemplary semiconductor memory device controls the switching with the bit line sense amplifier block array at the time the memory cell array is selected, and thus, is very small in current consumption due to a reduction in toggling that has been repeatedly performed whenever the active command and the precharge command are applied.

While the exemplary semiconductor memory device has been described with respect to the specific embodiments, it will be apparent to those skilled in the art that various changes and modifications may be made without departing from the spirit and scope of the subject matter as defined in the following claims.

What is claimed is:

1. A driving method of a semiconductor memory device in which adjacent upper and lower unit memory cell arrays share a bit line sense amplifier block array, comprising:
   coupling the upper memory cell array to the bit line sense amplifier block array in response to an active command; and
   controlling the coupling between the bit line sense amplifier block array and the upper memory cell array in response to a selection sense signal and a precharge control signal,
   wherein the selection sense signal is based on a previously selected memory cell array being the same as a subsequently selected memory cell array.

2. A driving method of a semiconductor memory device in which adjacent upper and lower unit memory cell arrays share a bit line sense amplifier block array, comprising:
   coupling the upper memory cell array to the bit line sense amplifier block array in response to active command;
   controlling the coupling between the bit line sense amplifier block array and the upper memory cell array in response to a selection sense signal and a precharge control signal;
   sensing an active state of the bit line sense amplifier block array caused by a second active command; and
   decoupling the bit line sense amplifier block array from the upper and the lower unit memory cell arrays when the bit line sense amplifier block array is in the active state,
   wherein the selection sense signal is based on a previously selected memory cell array being the same as a subsequently selected memory cell array.

* * * * *